(12) United States Patent
Lee et al.

(10) Patent No.: US 10,267,866 B2
(45) Date of Patent: Apr. 23, 2019

(54) CRACK DETECTOR AND METHOD OF DRIVING CRACK DETECTOR

(71) Applicant: Samsung Display Co., Ltd., Yongin-si, Gyeonggi-Do (KR)

(72) Inventors: Seung-Jun Lee, Hwaseong-si (KR); O-Gweon Seo, Yongin-si (KR); Hong-Kwon Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 38 days.

(21) Appl. No.: 15/382,440

(22) Filed: Dec. 16, 2016

(65) Prior Publication Data
US 2017/0192065 A1    Jul. 6, 2017

(30) Foreign Application Priority Data
Dec. 30, 2015    (KR) .................. 10-2015-0189525

(51) Int. Cl.
| | |
|---|---|
| G09G 3/3208 | (2016.01) |
| G01R 31/44 | (2006.01) |
| G09G 3/3266 | (2016.01) |
| G09G 3/3283 | (2016.01) |
| G09G 3/3225 | (2016.01) |

(52) U.S. Cl.
CPC ............ *G01R 31/44* (2013.01); *G09G 3/3225* (2013.01); *G09G 3/3266* (2013.01); *G09G 3/3283* (2013.01); *G09G 3/3208* (2013.01); *G09G 2300/043* (2013.01); *G09G 2310/08* (2013.01); *G09G 2330/00* (2013.01); *G09G 2330/12* (2013.01); *G09G 2360/16* (2013.01)

(58) Field of Classification Search
None
See application file for complete search history.

(56) References Cited

FOREIGN PATENT DOCUMENTS

| | | |
|---|---|---|
| KR | 10-2013-0003247 A | 1/2013 |
| KR | 10-2014-0141276 A | 12/2014 |
| KR | 10-2015-0095987 A | 8/2015 |

*Primary Examiner* — Brian M Butcher
(74) *Attorney, Agent, or Firm* — Innovation Counsel LLP

(57) ABSTRACT

A method of driving a crack detector of an organic light emitting display device according to example embodiments includes: determining an image load of a display panel with respect to image data corresponding to an emission period of the organic light emitting display device when it is driven according to a simultaneous emission driving method, calculating a first sensing value corresponding to a power current that flows into a power supply during the emission period, determining a first crack reference value based on the image load, and determining whether the display panel is cracked by comparing the first crack reference value with the first sensing value.

20 Claims, 10 Drawing Sheets

CRACK DETECTOR AND METHOD OF DRIVING CRACK DETECTOR

CROSS REFERENCE TO RELATED APPLICATION

This application claims priority to, and the benefit of, Korean Patent Application No. 10-2015-0189525 filed on Dec. 30, 2015 in the Korean Intellectual Property Office (KIPO), the disclosure of which is hereby incorporated by reference herein in its entirety.

BACKGROUND

1. Field

Example embodiments of the inventive concept relate generally to display devices. More particularly, example embodiments of the inventive concept relate display devices having crack detectors, and associated driving methods.

2. Discussion of Related Art

An organic light emitting display device, which displays an image using organic light emitting diodes that emit light by a recombination of electrons and holes, is often characterized by a wide view angle, rapid response speed, low profile, and low power consumption.

The organic light emitting display device commonly includes a detection circuit for detecting cracks in its display panel, shorts, overcurrents, etc. and blocked power supplies. The detection circuit performs detecting and sampling during a limited detection period (e.g., a portion of a non-emission period or a vertical blank) within a frame. The detection period is often very short, e.g., about 50 μs. And the detection circuit determines only whether a power current is detected or not, during the non-emission period. Thus, crack detection sensitivity is relatively low. In particular, in a large size display panel (e.g. above 50-inch display size), accuracy in crack detection significantly drops.

SUMMARY

Example embodiments provide a method of driving a crack detector that determines the presence of a display panel crack by analyzing a power current based on an image load in an emission period and/or a non-emission period of an organic light emitting display device.

Example embodiments provide the crack detector.

According to example embodiments, a method of driving a crack detector of an organic light emitting display device may comprise determining an image load of a display panel with respect to image data corresponding to an emission period of the organic light emitting display device when the organic light emitting display device is driven according to a simultaneous emission driving method, calculating a first sensing value corresponding to a power current that flows into a power supply during the emission period, determining a first crack reference value based on the image load, and determining whether the display panel is cracked by comparing the first crack reference value with the first sensing value.

In example embodiments, the calculating a first sensing value may further comprise detecting the power current multiple times during a predetermined sensing period within the emission period, and determining the first sensing value based on a plurality of the detected power currents.

In example embodiments, the first sensing value may further correspond to one of an average of the detected power currents, a maximum value of the detected power currents, and a minimum value of the detected power currents.

In example embodiments, the first crack reference value may have a predetermined tolerance range.

In example embodiments, the determining whether the display panel is cracked may further comprise comparing the first sensing value with the first crack reference value and shutting down power supply when the first sensing value is not within the tolerance range of the first crack reference value.

In example embodiments, the method may further comprise calculating a second sensing value corresponding to a power current that flows into the power supply during a data writing period of a non-emission period of the organic light emitting display device, and comparing a second crack reference value with the second sensing value.

In example embodiments, the second crack reference value may correspond to zero.

In example embodiments, the second crack reference value may have a predetermined tolerance range.

In example embodiments, the comparing a second crack reference value with the second sensing value may further comprise determining the image load based on the image data corresponding to the non-emission period and shutting down power supply when the second sensing value is not within the tolerance range of the second crack reference value.

In example embodiments, a second crack reference value variation is determined according to an image load variation and may be less than a first crack reference value variation depending on the image load variation.

In example embodiments, the image load may correspond to an average of luminance of the frame.

In example embodiments, the image load may correspond to an average of grayscale of the frame.

According to example embodiments, a crack detector for an organic light emitting display device may comprise a current detector disposed at an external circuit board of a display panel which is configured to be driven according to a simultaneous emission driving method and configured to calculate a sensing value of a power current that flows into a power supply during an emission period, an image load determiner configured to determine a crack reference value corresponding to an image load of the display panel, and a power controller configured to perform a comparison of the crack reference value to the sensing value, and to control power the supply according to the comparison.

In example embodiments, the current detector may comprise a sensing resistor configured to detect the power current during a predetermined sensing period in the emission period and a sensing value calculator configured to convert a plurality of the detected power currents into a digital signal, and to calculate the sensing value based on the digital signal.

In example embodiments, the sensing value calculator may be configured to calculate at least one of an average of the detected power currents, a maximum value of the detected power currents, and a minimum value of the detected power currents.

In example embodiments, the image load determiner may be configured to calculate the image load based on grayscales of image data, and to determine the crack reference value corresponding to the image load.

In example embodiments, the image load determiner may comprise a memory configured to store a plurality of the determined crack reference values according to a plurality of levels of the image load.

In example embodiments, the crack reference value may have a predetermined tolerance range.

In example embodiments, the power controller may be configured to output a shut down signal to shut down the power supply when the sensing value is not within the tolerance range of the crack reference value.

In example embodiments, the current detector may be further configured to calculate the sensing value during a data writing period in a non-emission period. The power controller may be configured to compare the crack reference value with the sensing value to control a supply of power.

Therefore, methods of driving the crack detector included in the organic light emitting display device according to example embodiments may compare the first crack reference value depending on the image load with the power current detected in the emission period of each frame, to thereby detect the crack of the display panel (or malfunctions of the display panel). Thus, crack detection sensitivity and reliability can be improved. In addition, a current detection time and a current detection frequency per each frame are increased, so that crack detection sensitivity and reliability can be improved.

Further, methods of driving the crack detector may detect the power current during the data writing period of the non-emission period and compare the second crack reference value with the detected power current. Thus, the display panel crack (or malfunctions) may also be detected in the data writing period. Accordingly, current detection time and current detection frequency per each frame are increased so that crack detection sensitivity and reliability can be improved.

In addition, the crack detector may include only a single current detector connected to the power line of the circuit board, so that manufacturing costs and a volume or size of the crack detector may decrease. Crack detection may be performed during both the emission period and the non-emission period.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Exemplary embodiments will be described more fully hereinafter with reference to the accompanying drawings, in which various embodiments are shown. The various figures are not necessarily to scale. All numerical values are approximate, and may vary. All examples of specific materials and compositions are to be taken as nonlimiting and exemplary only. Other suitable materials and compositions may be used instead.

Figure 1A:
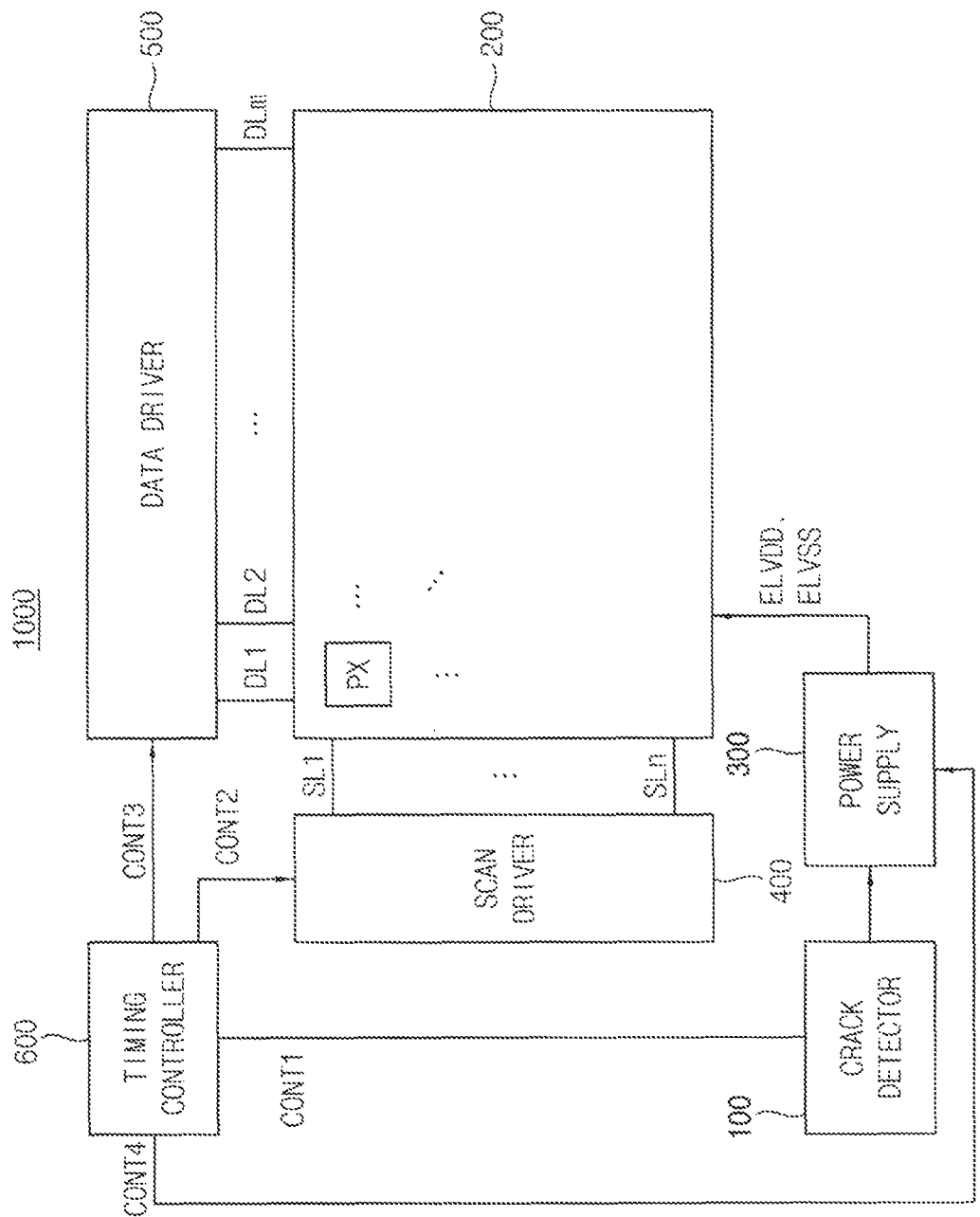
FIG. 1A is a block diagram of an organic light emitting display device according to example embodiments.
Figure 1B:
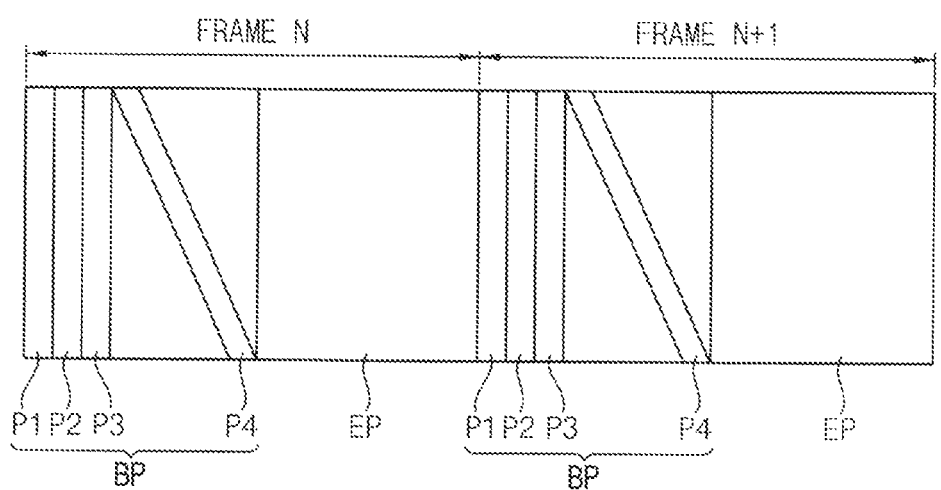
FIG. 1B is a diagram illustrating an example of a driving method for the organic light emitting display device of FIG. 1A.

FIG. 1A is a block diagram of an organic light emitting display device according to example embodiments. FIG. 1B is a diagram illustrating an example of a driving method for the organic light emitting display device of FIG. 1A.

Referring to FIGS. 1A and 1B, the organic light emitting display device 1000 may include a crack detector 100, a display panel 200, a power supply 300, a scan driver 400, a data driver 500, and a timing controller 600. In some embodiments, the organic light emitting display device 1000 may be driven using a simultaneous emission with active voltage ("SEAV") driving method.

In one embodiment, the organic light emitting display device 1000 may be a transparent display device, a flexible display device, a mirror display device, a curved display device, and so on.

The crack detector 100 may be located outside of the display panel 200. The crack detector 100 may detect a power current that flows into the power supply 300 and thereby determine whether the display panel 100 is cracked. The crack detector 100 may determine whether the display panel 100 is cracked based on a first control signal CONT1 received from the timing controller 600, and may also control a function of the power supply 300. In one embodiment, the crack detector 100 may detect a current flowing into the power supply 300 during an emission period of each frame. The crack detector 100 may analyze an image load and calculate a crack reference value. The crack detector 100 may compare a detected current with the crack reference value. When the detected value is not within a predetermined range based on the crack reference value, the crack detector 100 may determine that the display panel 100 is cracked and thus provide a shut down signal to the power supply 300 to shut down the power supply 300. In one embodiment, the crack detector 100 may detect a current at a power line where the second power voltage ELVSS is supplied. In one embodiment, the crack detector 100 may be disposed at an external circuit board which is electrically connected to the display panel 100. For example, the crack detector 100 may be embedded in the timing controller 600. Operations and constructions of the crack detector 100 will be described in detail with reference to FIGS. 2 through 9.

The display panel 200 may include a plurality of pixels PX. The display panel 200 may be connected to the scan driver 400 via a plurality of scan lines SL1 to SLn (i.e., n scan lines, n being a positive integer). The display panel 200 may also be connected to the data driver 500 via a plurality of data lines DL1 to DLm (i.e., m data lines, m being a positive integer). The display panel 200 may include n*m pixels PX, as the pixels PX are arranged at locations corresponding to crossing regions of the scan lines SL1 to SLn and the data lines DL1 to DLm. The display panel 200 may receive a first power voltage ELVDD and a second power voltage ELVSS from the power supply. The first and second power voltages ELVDD and ELVSS may be used in pixel PX emission.

The scan driver 400 may provide a scan signal to the pixels PX via the scan lines SL1 to SLn, based on a second control signal CONT2.

The data driver 500 may provide a data signal to the pixels PX via the data lines DL1 to DLm, based on a third control signal CONT3

The power supply 300 may provide the first and second power voltages ELVDD and ELVSS to the pixels PX based on a fourth control signal CONT4. The first and second power voltages ELVDD and ELVSS may be driving voltages for driving the display panel 200. In the simultaneous emission driving method, voltage levels of the first and second power voltages ELVDD and ELVSS may swing according to an emission period and/or a non-emission period. In one embodiment, the power supply 300 may stop providing the power by receiving the shut down signal from the crack detector 100.

The timing controller 600 may provide first to fourth control signals CONT1, CONT2, CONT3 and CONT4 to the crack detector 100, the power supply 300, the scan driver 400 and the data driver 500 to thereby control the crack detector 100, the scan driver 400 and the data driver 500, and the power supply 300, respectively.

As illustrated in FIG. 1B, a single frame according to the simultaneous emission driving method may include a non-emission period (e.g., a black period) BP and an emission period EP. A plurality of data signals may be transferred and written to the pixels PX in the non-emission period BP. After the writing operation completes, each of the pixels may simultaneously emit light according to the written data signals, during the emission period EP. That is, in the simultaneous emission driving method, during a single frame, the single frame data are sequentially written and then all of the pixels PX in the display panel 200 may emit light at a time.

In some embodiments, the single frame of the simultaneous emission driving method may include an initialization period P1, a reset period P2, a threshold voltage compensation period P3, a scan period (or a data writing period) P4, and the emission period EP. The initialization period P1, the reset period P2, the threshold voltage compensation period P3 and the scan period P4 may be included in the non-emission period P4. In one embodiment, the data writing may be sequentially performed corresponding to each scan line. Operations in the initialization period P1, the reset period P2, the threshold voltage compensation period P3, and the emission period EP may be simultaneously performed with respect to the all pixels PX.

The initialization period P1 may be a period in which each node voltage of each pixel circuit is initialized to have substantially the same voltage as a voltage when a threshold voltage is input. The reset period P2 may be a period in which a data voltage applied to each pixel PX is reset, so that an anode voltage of an organic light emitting diode is dropped below a cathode voltage of the organic light emitting diode and the organic light emitting diode does not emit light. For example, the power supply 300 may drop the first power voltage to a specific voltage level within the reset period P2. The threshold voltage compensation period P3 may be a period during which a threshold voltage of a driving transistor in each pixel PX is compensated, i.e. adjusted to some desired level. Accordingly, the second power voltage ELVSS in the non-emission period BP may be less than the second power voltage ELVSS in the emission period EP.

Figure 2:
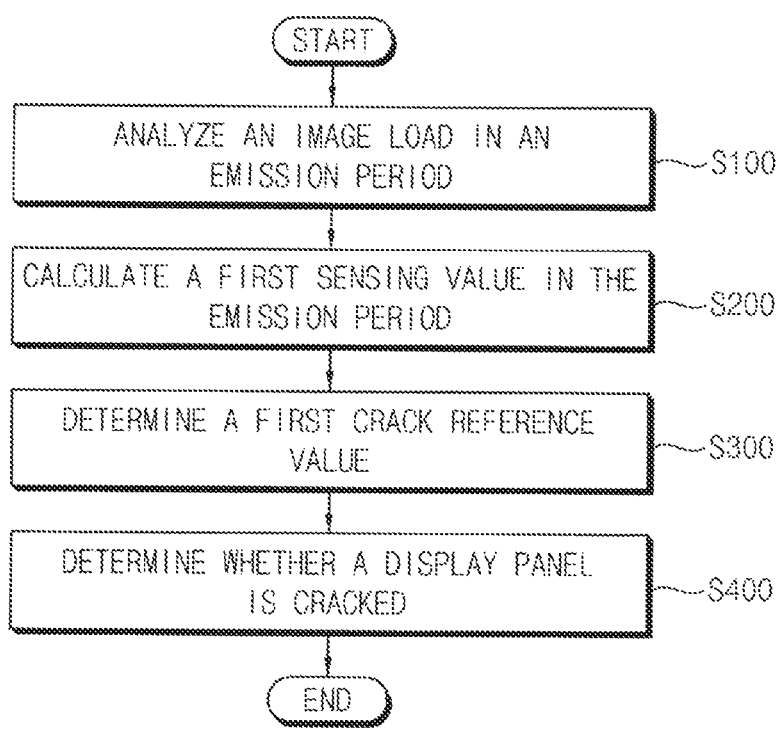
FIG. 2 is a flowchart of a method for driving a crack detector according to example embodiments.
Figure 3:
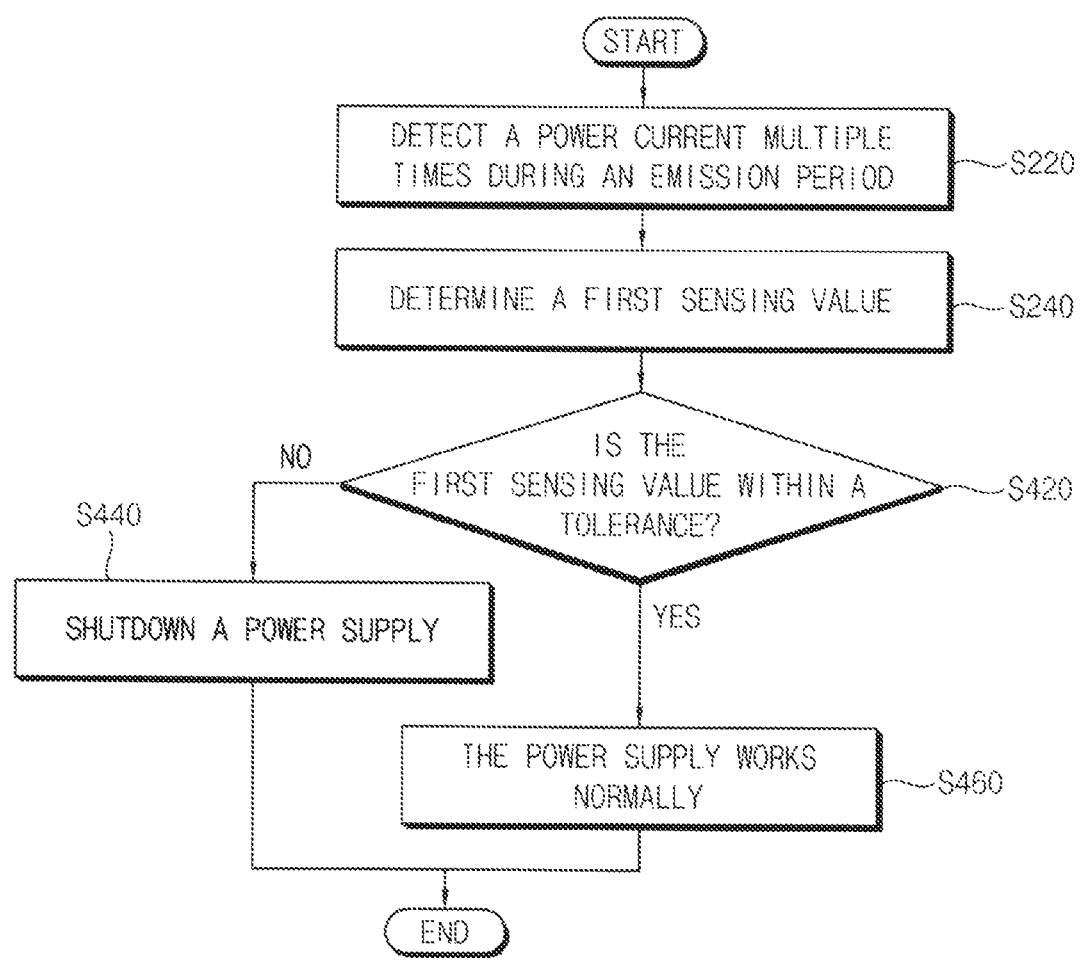
FIG. 3 is a flowchart illustrating an example of the method for driving a crack detector of FIG. 2.

FIG. 2 is a flowchart of a method for driving a crack detector according to example embodiments. FIG. 3 is a flowchart illustrating an example of the method for driving a crack detector of FIG. 2.

Referring to FIGS. 1A through 3, the method for driving the crack detector in the organic light emitting display device may include analyzing an image data (S100), calculating a first sensing value (S200), determining a first crack reference value (S300), and determining whether a display panel is cracked (S400).

The organic light emitting display device may be driven as a simultaneous emission driving method, so that a frame may include a non-emission period BP for sequentially writing data voltages into pixels PX, and an emission period for simultaneously emitting light at all pixels PX.

The image load of the display panel 200 with respect to the frame may be analyzed based on image data during the emission period EP. In one embodiment, the image data may include grayscales and/or luminances of all pixels PX with respect to the frame. The image load may thus be determined by total sum of all grayscales and/or luminances for every pixel PX of that frame. For example, the image load may have a maximum value when the display panel 200 displays a full-white image, and the image load may have a minimum value when the display panel 200 displays a black image. A driving current (i.e., a power current) may be changed based on the grayscales and/or luminances.

In some embodiments, the image load may correspond to an average luminance of the frame. In some embodiments, the image load may correspond to an average grayscale of the frame. The image load may be divided into a plurality of load levels based on the luminance average or the grayscale average of the image data. Since these are examples, methods for calculating the image load of each frame are not limited to those described herein; rather, any suitable methods are contemplated.

The first sensing value, corresponding to the power current that flows into the power supply 300 during the emission period EP, may be calculated (S200). In one embodiment, the power current may correspond to a current at a common power line where the second power voltage ELVSS is applied. The crack detector 100 may detect the power current flowing through the common power line which is outside the display panel 100.

In one embodiment, the power current may be detected multiple times during a predetermined sensing period within the emission period EP (S220). For example, the sensing period may be set to about 2 ms and the current detection operation may be performed more than 100 times. Thus, sufficient time may be ensured for detecting the power current, whereby the current detection sensitivity can be improved.

In one embodiment, the first sensing value may be calculated based on the detected power currents (S240). The first sensing value may correspond to a selected one of an average of the detected power currents, a maximum value of the detected power currents, and a minimum value of the detected power currents. For example, the detected power currents may be provided to an analog-digital converter and converted into digital values. An average of the converted digital values may be calculated. Accordingly, the average of the detected power currents may be determined as the first sensing value. In one embodiment, the first sensing value may correspond to an average of power currents detected over a plurality of frames. For example, an average of first sensing values of a set of 16 continuous frames may be determined as a new sensing value, and the sensing value may be updated per frame based on the first sensing value that is generated (calculated) every frame.

The first crack reference value may be determined based on the image load (S300). The first crack reference value may correspond to a current value flowing into the common power line for emission of light during the emission period EP according to the image load. In other words, a normal current corresponding to the first crack reference value may flow through the power line during the emission period EP when the display panel normally displays an image based on the image data. The first crack reference value may correspond to a digitized value converted from the normal current. The first crack reference value may change based on the image load. In one embodiment, the first crack reference value may be stored in a lookup table according to a level of the image load. In one embodiment, the first crack reference value may be stored in a register type according to the level of the image load. The crack detector 100 may extract the first crack reference value corresponding to the analyzed image load, from the lookup table or the register. In one embodiment, the first crack reference value may have a predetermined tolerance range. The tolerance range may be set differently depending on the image load.

The crack detector 100 may determine whether the display panel 200 is cracked, by comparing the first crack reference value with the first sensing value (S400). In one embodiment, the first sensing value and the first crack reference value may be compared (S420).

The crack detector 100 may determine that the display panel 200 is normally operated when the first sensing value is within the tolerance range of the first crack reference value. Thus, the power supply 300 may normally operate (S460). In one embodiment, the crack detector 100 may provide an enable signal to the power supply 300 to control the function of the power supply 300. For example, the enable signal may have an active level when the first sensing value is within the tolerance range of the first crack reference value, so that the power supply 300 may provide power to the display panel 200 as normal.

The crack detector 100 may determine that the display panel 200 is cracked when the first sensing value is not within the tolerance range of the first crack reference value. For example, a circuit short may be generated by the crack and thus an overcurrent may be generated in the display panel 200. Thus, when the first sensing value is not within the tolerance range of the first crack reference value, the crack detector 100 may shut down the power supply 300 (S440). Accordingly, power supplied to the display panel 200 may be stopped. In one embodiment, the enable signal may be set to an inactive level when the first sensing value is not within the tolerance range of the first crack reference value, so that the power supply 300 may be shut down. In one embodiment, the crack detector 100 may generate a shut down signal and provide this shut down signal to the power supply 300 to shut down the power supply 300, when the first sensing value is not within the tolerance range of the first crack reference value.

As described above, the method of driving the crack detector according to example embodiments may compare the first crack reference value to the power current detected in the emission period EP of each frame, and detect a crack in the display panel 200 (or malfunctions of the display panel 200) accordingly. That is, the first crack reference value may be adjusted based on an image change and/or display panel property change, so that crack detection sensitivity and reliability can be improved. In addition, a current detection time and a current detection frequency per each frame are increased, so that crack detection sensitivity and reliability can be improved.

Figure 4:
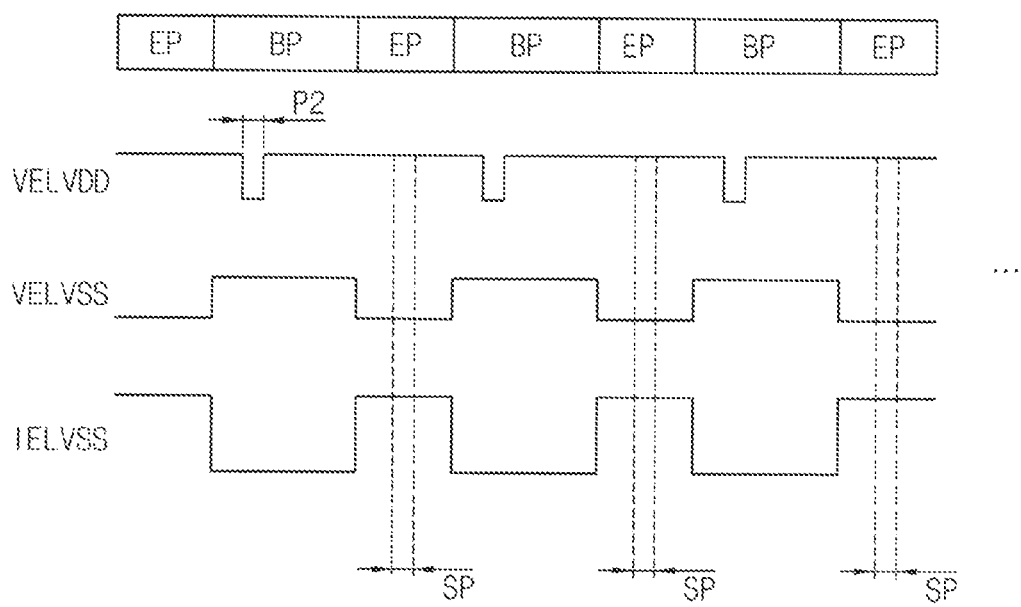
FIG. 4 is a timing diagram illustrating an example of a period for detecting a power current in the method for driving a crack detector of FIG. 2.

FIG. 4 is a timing diagram illustrating an example of a period for detecting a power current of the method for driving a crack detector of FIG. 2.

Referring to FIG. 4, the crack detector may detect a power current IELVSS during a predetermined sensing period SP within an emission period EP.

In a simultaneous emission driving method, a first power voltage VELVDD may have a first low voltage level in a reset period P2 of a non-emission period BP, and have a first high voltage level at other times. A second power voltage VELVSS may have a second low voltage level in the emission period EP and have a second high voltage level in the non-emission period BP. The second high voltage level and the first low voltage level may be set so that the display panel 200 does not emit light. For example, the second high voltage level may be substantially the same as the first low voltage level. Accordingly, the pixels do not emit light. Further, in this situation, the power current IELVSS may not flow through a power line at which the second power voltage VELVSS is applied.

In one embodiment, the method for driving the crack detector may detect the power current IELVSS during the sensing period SP. In one embodiment, the power current IELVSS may correspond to a current of the power line at which the second power voltage VELVSS applied. The crack detector may detect the power current IELVSS of the power line that supplies power to the display panel from an external source. In one embodiment, the sensing period SP may be set to about 2 ms and the current detection operation may be performed more than 100 times. Thus, it can be ensured a sufficient time for detecting the power current, whereby the current detection sensitivity can be improved.

Figure 5:
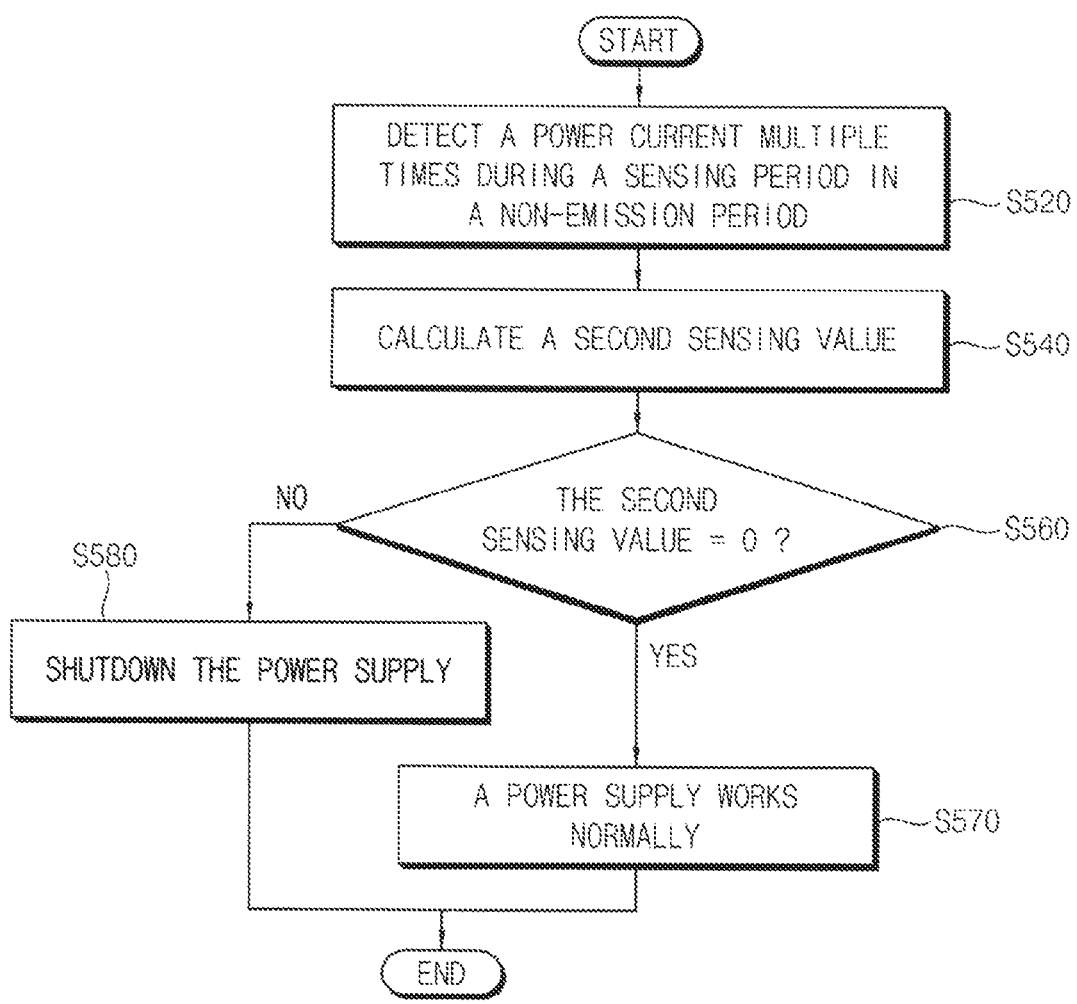
FIG. 5 is a flowchart illustrating another example of the method for driving a crack detector of FIG. 2.

FIG. 5 is a flowchart illustrating another example of the method of driving a crack detector of FIG. 2.

Referring to FIGS. 2, 3, and 5, the method for driving the crack detector may further include detecting the power current multiple times during the sensing period within the non-emission period BP (S520), calculating a second sensing value (S540), and comparing a predetermined second crack reference value to the second sensing value (S560) to determine whether the display panel is cracked.

In one embodiment, the method for driving the crack detector may also detect the power current, and determine whether the display panel is cracked, during the non-emission period. The power current does not flow through a power line during a data writing period (e.g., the sensing period) when the display panel normally operates. Thus, the crack detector cannot detect the power current during the data writing period (e.g., the sensing period) when the display panel normally operates. When the power current is detected during the data writing period, the crack detector may determine that the display panel abnormally operates. Accordingly, in some embodiments, the second crack reference value may correspond to zero. Since a leakage current can be generated, the second crack reference value may have a predetermined tolerance range.

The power current may be detected multiple times during the sensing period of the non-emission period BP (S520). In one embodiment, the sensing period may be included in the data writing period of the non-emission period BP. For example, the sensing period may be set to about 2 ms and the current detection operation may be performed more than 100 times. Thus, sufficient time is provided for detecting the power current, whereby the power current detection sensitivity can be improved.

In one embodiment, the second sensing value may be calculated based on the detected power currents (S540). The second sensing value may correspond to a selected one of an average of the detected power currents, a maximum value of the detected power currents, and a minimum value of the detected power currents. For example, the detected power currents may be provided to an analog-digital converter and converted into digital values. An average of the converted digital values may be calculated. Accordingly, the average of the detected power currents may be determined as the second sensing value.

The crack detector may compare the second crack reference value with the second sensing value to determine whether the display panel is cracked (S560). When the display panel operates normally, the power current does not flow through the power line during the data writing period.

The crack detector may determine that the display panel operates normally, when the second sensing value is within the tolerance range of the second crack reference value. Thus, the power supply may continue to operate normally (S570).

The crack detector may determine that the display panel is cracked, when the second sensing value is not within the tolerance range of the second crack reference value. Thus, the power supply may be shut down (S580). Accordingly, power supply to the display panel may be stopped.

As described above, the method for driving the crack detector may further detect the power current during the data writing period of the non-emission period, and compare the second crack reference value with the detected power current. Thus, a display panel crack (or malfunctions) may also be detected during the data writing period.

Figure 6:
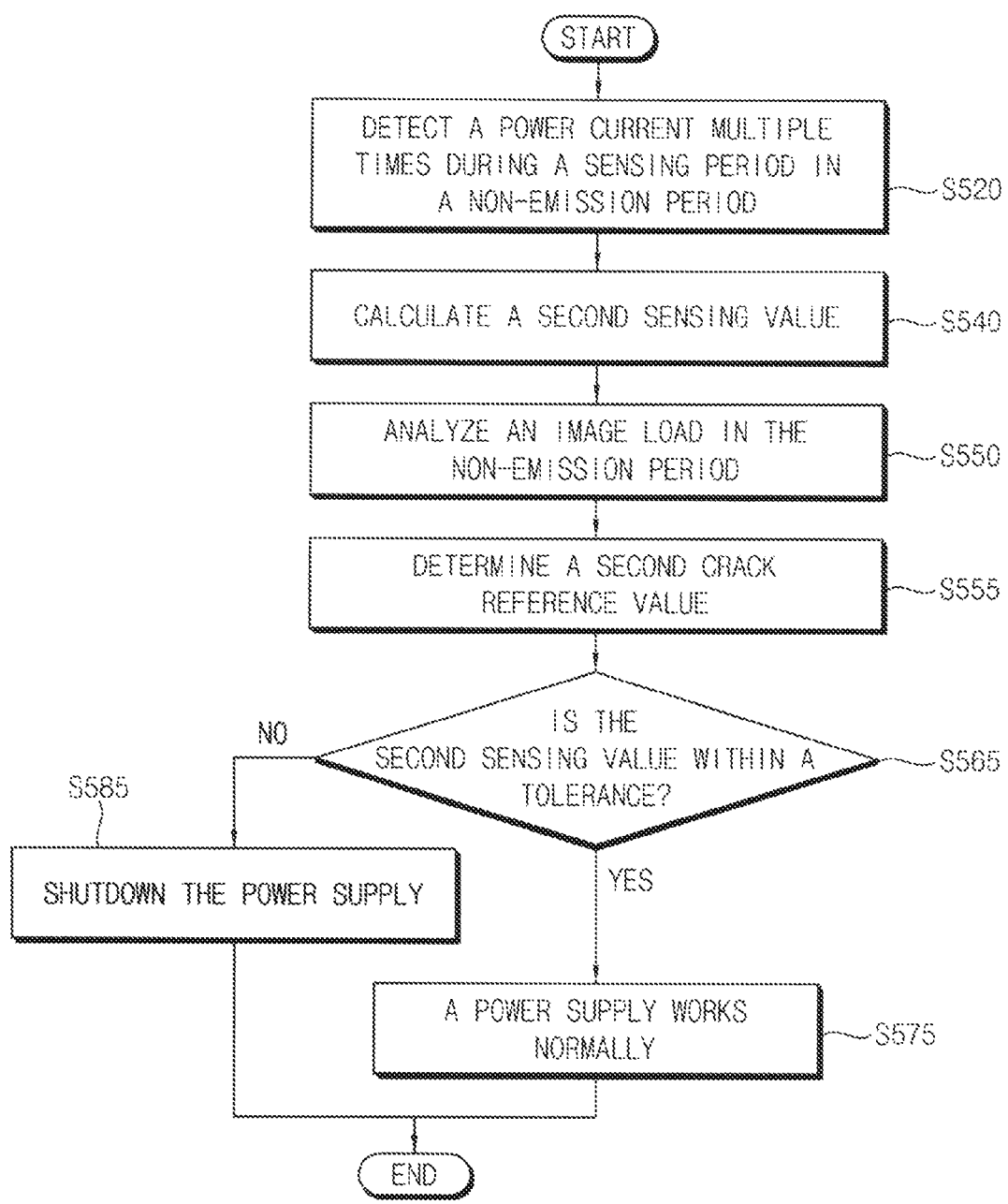
FIG. 6 is a flowchart illustrating still another example of the method for driving a crack detector of FIG. 2.

FIG. 6 is a flowchart illustrating still another example of the method for driving a crack detector of FIG. 2.

Referring to FIGS. 2, 3, and 6, the method for driving the crack detector may further include detecting the power current multiple times during the sensing period of the non-emission period BP (S520), calculating a second sensing value (S540), analyzing an image load in the non-emission period BP (S550), determining a second crack reference value (S555), and comparing the second crack reference value with the second sensing value (S565) to determine whether the display panel is cracked.

Since the methods for detecting the power currents and calculating the second sensing value (S520) and (S540) are described above referred to FIG. 5, descriptions of these will not be repeated.

The image load may be analyzed based on image data of the corresponding frame (S550). In one embodiment, the image data may include grayscales and/or luminances of all pixels PX with respect to the frame. A microcurrent may flow through the power line in the non-emission period due to leakage current of the display panel, even when the display panel operates normally. The microcurrent may change depend on the image load. Thus, a display panel crack may be detected by a method similar to the crack detection method in the emission period EP described in connection with FIG. 3.

The second crack reference value may be determined based on the image load (S555). The second crack reference value may correspond to the microcurrent flowing through the power line. For example, the second crack reference value may be close to zero (or 0mA). Accordingly, a second crack reference value variation with respect to an image load variation is less than a first crack reference value variation depending on the image load variation.

In some embodiments, the second crack reference value may have a predetermined tolerance range. The tolerance range may be set based on properties of the display panel. In one embodiment, the second crack reference value may correspond to a digital type value that the image load is converted into. In one embodiment, the second crack reference value may be stored in a lookup table according to a level of the image load. In one embodiment, the second crack reference value may be stored in a register type according to the level of the image load.

The second crack reference value and the second sensing value are compared, to determine whether the display panel is cracked (S565). The crack detector may determine that the display panel is normally operated when the second sensing value is within the tolerance range of the second crack reference value. Thus, the power supply may be allowed to operate normally (S575).

The crack detector may determine that the display panel is cracked when the second sensing value is not within the tolerance range of the second crack reference value. Thus, when the second sensing value is not within the tolerance range of the second crack reference value, the crack detector may shut down the power supply (S585). Accordingly, power supplied to the display panel may be stopped.

The method for driving the crack detector according to the present embodiments may detect the display panel crack during the emission period EP, based on the first crack reference value and the second sensing value that is detected in the emission period EP. The method may also detect the display panel crack during the non-emission period BP, based on the second crack reference value and the second sensing value that is detected in the non-emission period (e.g., the data writing period).

As described above, the method for driving the crack detector may further detect the power current in the data writing period of the non-emission period BP, and detect the display panel cracks based on the second crack reference value. Thus, crack detection sensitivity and reliability may be improved. In addition, a current detection time and a current detection frequency per each frame are increased so that the crack detection sensitivity and reliability can be improved.

Figure 7:
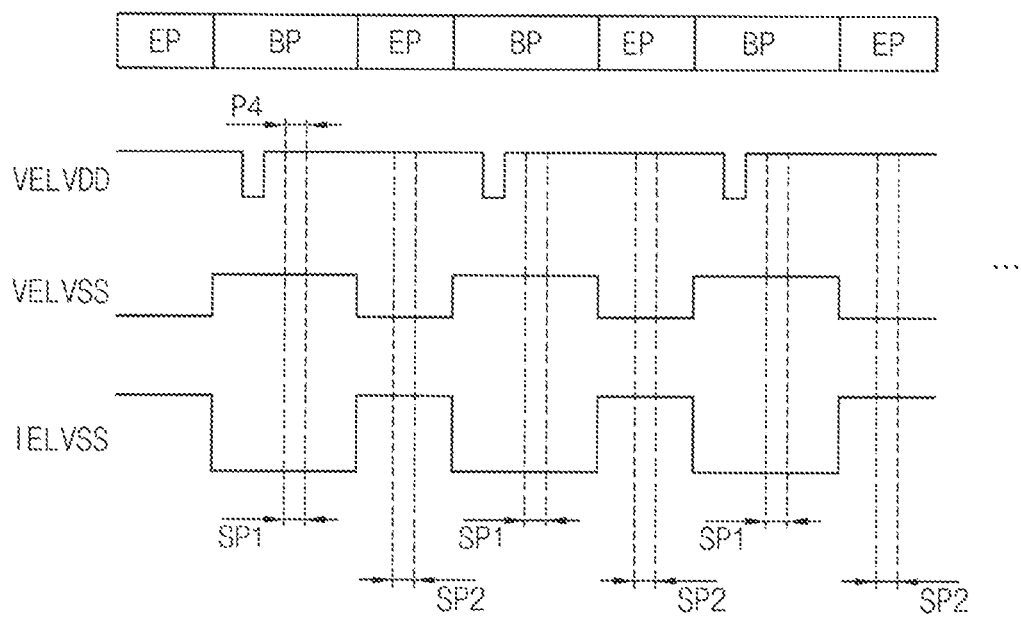
FIG. 7 a timing diagram illustrating an example of a period for detecting a power current of the method for driving a crack detector of FIG. 6.

FIG. 7 is a timing diagram illustrating an example of a period for detecting a power current according to the method for driving a crack detector of FIG. 6.

In FIG. 7, like reference numerals are used to designate elements the same as those in FIG. 4, and detailed description of these elements may be omitted.

Referring to FIG. 7, the crack detector may detect a power current IELVSS during a first sensing period SP1 of the non-emission period BP and a second sensing period SP2 of the emission period EP.

In one embodiment, the first sensing period SP1 may be included in the data writing period P4 of FIG. 1B. Each of the first and second sensing periods SP1 and SP2 may be set to about 2 ms. The current detection operation in each sensing period may be performed more than 100 times. Thus, sufficient time is allowed for detecting the power current within a frame, whereby the power current detection sensitivity can be improved.

Figure 8:
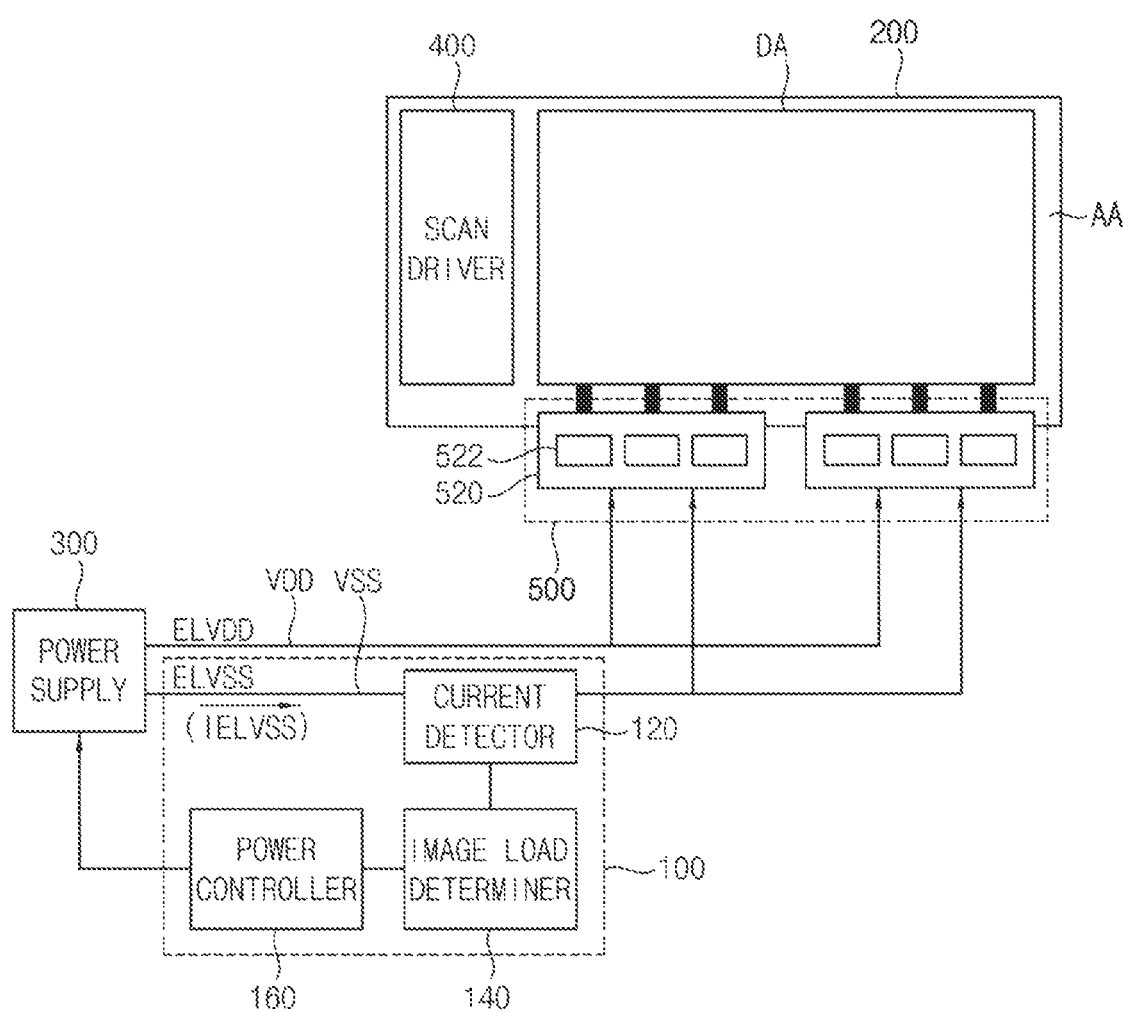
FIG. 8 is a block diagram of a crack detector according to example embodiments.
Figure 9:
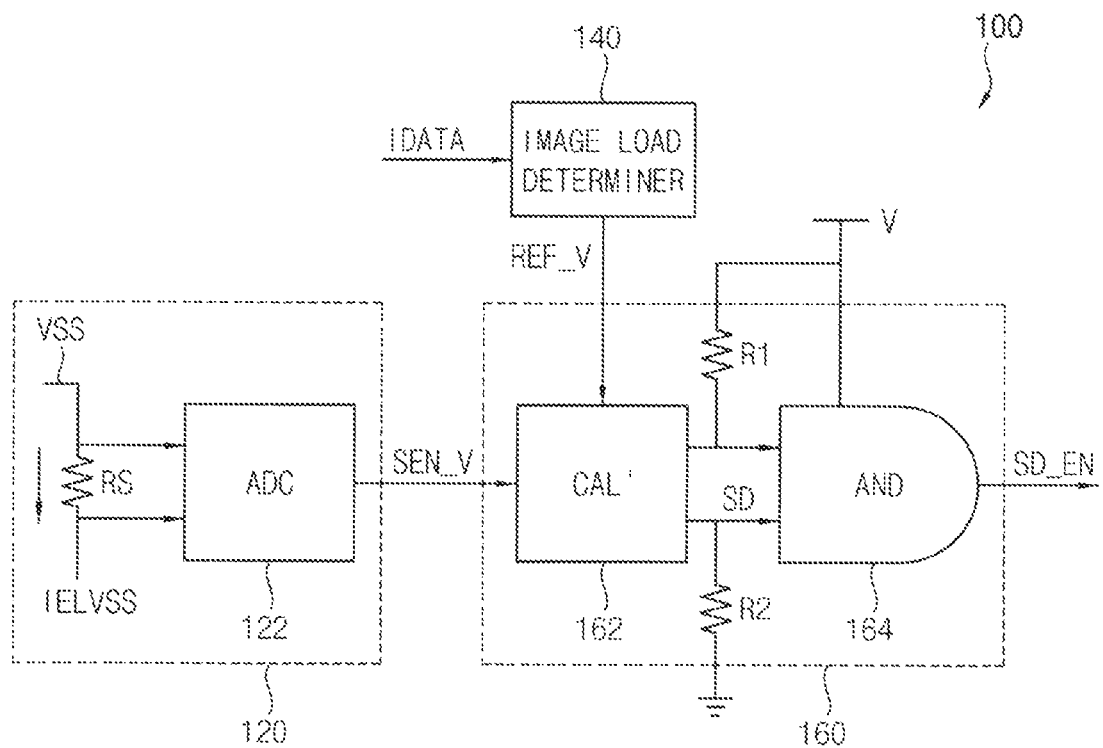
FIG. 9 is a diagram illustrating an example of the crack detector of FIG. 8.

FIG. 8 is a block diagram of a crack detector according to example embodiments. FIG. 9 is a diagram illustrating an example of the crack detector of FIG. 8.

Referring to FIGS. 8 and 9, the crack detector 100 included in a display device may include a current detector 120, an image load determiner 140, and a power controller 160.

The display device may be an organic light emitting display device and may be driven by the simultaneous emission driving method described above. In one embodiment, the organic light emitting display device may be a large display device above about 50 inches.

A scan driver 400 and a data driver 500 may be disposed on a non-display area AA peripheral to a display area DA of a display panel 200. In one embodiment, the scan driver 400 may be formed in the display panel 200 in the form of a gate-in panel along with a transistor fabrication process for the pixels. In one embodiment, the data driver 500 be implemented in the form of a plurality of integrated circuits (ICs), and installed on a plurality of flexible printed circuit boards 520.

The crack detector 100 may be formed on a circuit board. In one embodiment, the circuit board may further include a timing controller. The circuit board may be connected to the flexible printed circuit board 520. In this configuration, a first power voltage ELVDD output from a power supply 300 may be provided to a first power line VDD formed from the circuit board to the display panel 200, and a second power voltage ELVSS output from the power supply 300 may be provided to a second power line VSS formed from the circuit board to the display panel 200. Only a single current detector 120 may be required to detect the power current IELVSS at the second power line VSS. And the crack detector 100 may be constructed or programmed to shut down (or turn off) the power supply 300 when an abnormal power current (e.g., an overcurrent) is generated at the second power line VSS.

The current detector 120 may be formed on the circuit board and connected to the second power line VSS. The current detector 120 may detect the power current IELVSS during an emission period and calculate a sensing value SEN_V (e.g., a first sensing value) based on the power current IELVSS. In one embodiment, the current detector 120 may include a sensing resistor RS that outputs the power current IELVSS during a predetermined sensing period within the emission period, and a sensing value calculator 122 that converts a plurality of power currents from the sensing resistor RS into a digital signals and calculates the sensing value. For example, the current detector 120 may detect the power current IELVSS more than 100 times during the emission period.

The sensing value calculator 122 may include an analog-to-digital converter converting the analog type power current IELVSS into a digital signal. In one embodiment, the sensing value calculator 122 may calculate a selected one of an average of the detected power currents, a maximum value of the detected power currents, and a minimum value of the detected power currents as the sensing value SEN_V. The sensing value SEN_V may be provided to a calculator 162.

In one embodiment, the current detector 120 may further calculate a second value (e.g., a second sensing value) of the power current IELVSS at a data writing period of a non-emission period.

The image load determiner 140 may determine a crack reference value REF_V corresponding to an image load on the display panel, based on image data IDATA of the corresponding frame. The image load determiner 140 may determine the image load based on grayscales or luminances of the image data IDATA. The image load may change based on the grayscales and/or luminances. For example, the image load may have a maximum value when the display panel 200 displays a full-white image, and the image load may have a minimum value when the display panel 200 displays a black image. In one embodiment, the image load determiner may include a memory to store a plurality of predetermined crack reference values according to a plurality of levels of the image load. For example, the crack reference values may be stored in a lookup table type or a register type according to the level of the image load. The image load determiner 140 may extract the crack reference value corresponding to the analyzed image load from the lookup table or the register.

In one embodiment, the crack reference value REF_V may have a predetermined tolerance range. As one example, the tolerance range may depend on the image load. For instance, when the tolerance range is set to "DELTA", the sensing value SEN_V may be determined to be in a normal state when within a range from "REF_V−DELTA" to "REF_V+DELTA". In one embodiment, the image load determiner 140 may output the crack reference value REV_V having a value of zero when the current detector 120 detects the sensing value SEN_V during the data writing period of the non-emission period. In this case, the power current IELVSS may be detected as about zero, when the display panel 200 normally operates.

The power controller 160 may compare the crack reference value REF_V with the sensing value SEN_V and control power supply accordingly. In one embodiment, the power controller 160 may determine that the display panel 200 is cracked when the sensing value SEN_V is not within the tolerance range of the crack reference value REF_V (e.g., within a range form "REF_V−DELTA" to "REF_V+DELTA"). Thus, the power controller 160 may output a shut down signal SD to shut down the power supply 300. In one embodiment, the power controller 160 may include a calculator 162 to compare the crack reference value REF_V with the sensing value SEN_V and to output a logic high level or a logic low level of the shut down signal SD, as well as an AND gate 164 to perform a logic AND operation on outputs from the calculator 162. In one embodiment, a logic level of an enable signal SD_EN controlling the power supply may be controlled by the operation of the AND gate 164. The power controller 160 may detect a display crack based on the sensing value SEN_V and the crack reference value REF_V, and output the enable signal SD_EN (or shut down signal) for controlling the power supply 300 during at least one of the emission period and the non-emission period.

As described above, the crack detector 100 included in the display device according to example embodiments may include only a single current detector 120 connected to the power line VS S of the circuit board, such that manufacturing costs and a volume of the crack detector 100 may decrease. In addition, crack detection may be performed in both the emission period and the non-emission period based on the image load, such that crack detection sensitivity and reliability can be improved.

The present embodiments may be applied to any display device and any system including a crack detector. For example, the present embodiments may be applied to a large display device having, e.g. a 50 inch display, and be applied to a transparent display device, a flexible display device, a mirror display device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein. Various features of the above described and other embodiments can thus be mixed and matched in any manner, to produce further embodiments consistent with the invention.

What is claimed is:

1. A method of driving a crack detector of an organic light emitting display device, the method comprising:
   determining an image load of a display panel with respect to image data corresponding to an emission period of the organic light emitting display device when the organic light emitting display device is driven according to a simultaneous emission driving method;
   calculating a first sensing value corresponding to a power current that flows out of a power supply during the emission period;
   determining a first crack reference value based on the image load;
   determining whether the display panel is cracked by comparing the first crack reference value with the first sensing value; and
   after determining that the display is cracked, changing a state of the power supply from an operating state to a shut-down state.

2. The method of claim 1, wherein the calculating a first sensing value further comprises:
   detecting the power current multiple times during a predetermined sensing period within the emission period; and
   determining the first sensing value based on a plurality of the detected power currents.

3. The method of claim 2, wherein the first sensing value further corresponds to one of an average of the detected power currents, a maximum value of the detected power currents, and a minimum value of the detected power currents.

4. The method of claim 2, wherein the first crack reference value has a predetermined tolerance range.

5. The method of claim 4, wherein the determining whether the display panel is cracked further comprises:
   comparing the first sensing value with the first crack reference value; and
   shutting down power supply when the first sensing value is not within the tolerance range of the first crack reference value.

6. The method of claim 2, further comprising:
   calculating a second sensing value corresponding to a power current that flows out of the power supply during a data writing period of a non-emission period of the organic light emitting display device; and
   comparing a second crack reference value with the second sensing value.

7. The method of claim 6, wherein the second crack reference value corresponds to zero.

8. The method of claim 6, wherein the second crack reference value has a predetermined tolerance range.

9. The method of claim 8, wherein the comparing a second crack reference value with the second sensing value further comprises:
   determining the image load based on the image data corresponding to the non-emission period; and
   shutting down power supply when the second sensing value is not within the tolerance range of the second crack reference value.

10. The method of claim 9, wherein a second crack reference value variation is determined according to an image load variation and is less than a first crack reference value variation depending on the image load variation.

11. The method of claim 1, wherein the image load corresponds to an average luminance of the frame.

12. The method of claim 1, wherein the image load corresponds to an average grayscale of the frame.

13. A crack detector for an organic light emitting display device, the crack detector comprising:
   a current detector disposed at an external circuit board of a display panel which is configured to be driven according to a simultaneous emission driving method and configured to calculate a sensing value of a power current that flows out of a power supply during an emission period;
   an image load determiner configured to determine a crack reference value corresponding to an image load of the display panel; and
   a power controller configured to perform a comparison of the crack reference value to the sensing value, and to change a state of the power supply according to the comparison.

14. The crack detector of claim 13, wherein the current detector comprises:
   a sensing resistor configured to detect the power current during a predetermined sensing period in the emission period; and
   a sensing value calculator configured to convert a plurality of the detected power currents into a digital signal, and to calculate the sensing value based on the digital signal.

15. The crack detector of claim 14, wherein the sensing value calculator is configured to calculate at least one of an average of the detected power currents, a maximum value of the detected power currents, and a minimum value of the detected power currents.

16. The crack detector of claim 14, wherein the image load determiner is configured to calculate the image load based on grayscales of image data, and to determine the crack reference value corresponding to the image load.

17. The crack detector of claim 16, wherein the image load determiner comprises:
   a memory configured to store a plurality of the determined crack reference values according to a plurality of levels of the image load.

18. The crack detector of claim 16, wherein the crack reference value has a predetermined tolerance range.

19. The crack detector of claim 18, wherein the power controller is configured to output a shut down signal to shut down the power supply when the sensing value is not within the tolerance range of the crack reference value.

20. The crack detector of claim 16, wherein the current detector is further configured to calculate the sensing value during a data writing period in a non-emission period, and wherein the power controller is configured to compare the crack reference value with the sensing value to control a supply of power.

\* \* \* \* \*